United States Patent
Al-Ghannam et al.

(10) Patent No.: US 9,310,416 B2
(45) Date of Patent: Apr. 12, 2016

(54) GSM/GPRS BASED METHOD, SYSTEM AND COMPUTER PROGRAMS TO DETERMINE AND LOCATE HIGH IMPEDANCE FAULTS ON MEDIUM VOLTAGE DISTRIBUTION NETWORKS IN HIGH RESISTIVITY

(71) Applicants: Saudi Arabian Oil Company, Dhahran (SA); King Saud University, Riyadh (SA)

(72) Inventors: Sami H. Al-Ghannam, Dhahran (SA); Yasin Khan, Riyadh (SA)

(73) Assignees: SAUDI ARABIAN OIL COMPANY (SA); KING SAUD UNIVERSITY (SA)

( * ) Notice: Subject to any disclaimer, the term of this patent is extended or adjusted under 35 U.S.C. 154(b) by 356 days.

(21) Appl. No.: 14/026,815

(22) Filed: Sep. 13, 2013

(65) Prior Publication Data

US 2014/0077820 A1    Mar. 20, 2014

Related U.S. Application Data

(60) Provisional application No. 61/701,643, filed on Sep. 15, 2012.

(51) Int. Cl.
*G01R 31/08* (2006.01)
*G01R 31/02* (2006.01)
(Continued)

(52) U.S. Cl.
CPC .............. *G01R 31/08* (2013.01); *G01R 31/021* (2013.01); *G01R 31/085* (2013.01); *G01R 31/086* (2013.01); *H02J 13/0075* (2013.01); *H02H 7/26* (2013.01)

(58) Field of Classification Search
CPC ..... G01R 31/08; G01R 31/085; G01R 31/086

USPC .......................................... 324/522, 539, 541
See application file for complete search history.

(56) References Cited

U.S. PATENT DOCUMENTS 4,851,782 A    7/1989 Jeerings et al.
5,839,093 A    11/1998 Novosel et al.
(Continued)

FOREIGN PATENT DOCUMENTS

EP    1001271 A1    5/2000

OTHER PUBLICATIONS

PCT International Search Report and the Written Opinion of the International Searching Authority dated Dec. 18, 2013; International Application No. PCT/US2013/059673; International File Date: Sep. 13, 2013.

(Continued)

*Primary Examiner* — Amy He
(74) *Attorney, Agent, or Firm* — Bracewell LLP; Constance Gall Rhebergen; Brad Y. Chin

(57) ABSTRACT

Embodiments of the present invention include systems, methods, computer-readable media, and computer programs to determine and locate one or more faults on a distribution network in a high resistivity area. Embodiments of the present invention include a plurality of open conductor devices positioned on lateral ends of a plurality of distribution transformers. Each of the plurality of open conductor devices are configured to, for example, determine abnormal voltage readings and communicate such readings to a master station over a GSM/GPRS communication network. The master station, in accordance with embodiments of the present invention, is configured to determine or verify the presence of one or more faults on the distribution network and the location of the one or more faults.

12 Claims, 11 Drawing Sheets

(51) Int. Cl.
*H02J 13/00* (2006.01)
*H02H 7/26* (2006.01)

(56) References Cited

U.S. PATENT DOCUMENTS

| | | | |
|---|---|---|---|
| 6,718,271 | B1 | 4/2004 | Tobin |
| 8,027,364 | B2 | 9/2011 | Becattini et al. |
| 8,077,049 | B2 | 12/2011 | Yaney et al. |
| 2005/0040809 | A1* | 2/2005 | Uber, III .............. G01R 15/142 324/117 R |
| 2008/0097706 | A1* | 4/2008 | McCormack .......... H02H 7/261 702/59 |
| 2009/0281679 | A1 | 11/2009 | Taft et al. |
| 2009/0289637 | A1 | 11/2009 | Radtke |
| 2010/0007354 | A1* | 1/2010 | Deaver, Sr. .......... G01R 31/025 324/539 |
| 2011/0074436 | A1 | 3/2011 | Nowicki et al. |

OTHER PUBLICATIONS

Bjerkan et al., "Reliable Detection of Downed and Broken Conductors", 19th International Conference on Electricity Distribution, Cired, May 21-24, 2007, pp. 1-4.

Bjerkan, "Efficient Fault Management using Remote Fault Indicators", Cired, Jun. 8-11, 2009, pp. 1-25.

Garcia-Santander et al., "Down-conductor fault detection and location via a voltage based method for radial distribution networks", IEE Proc., Mar. 2005, pp. 180-184, vol. 152, No. 2, IEE.

* cited by examiner

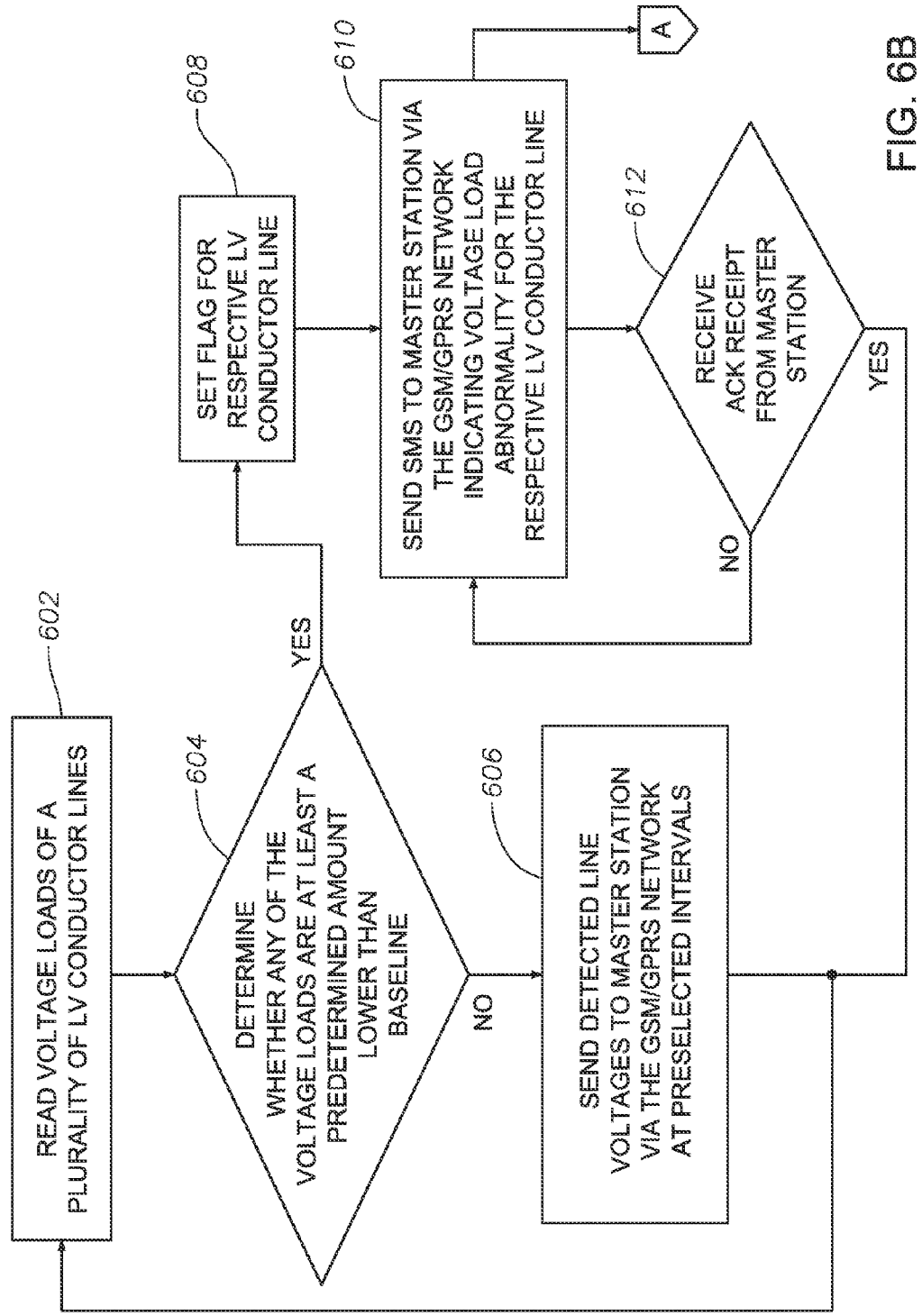

| No. | Message sent by (Command) | Phase voltages | Status |
|---|---|---|---|
| 1 | by operator (+Line) | P1 - 258V<br>P2 - 257V<br>P3 - 281V | Operational |
| 2 | By sensor (when an artificial fault was created) | P1 - 80V<br>P2 - 165V<br>P3 - 248V | Warning: Fault at Phase - B |
| 3 | By sensor (when the created artificial fault was cleared) | P1 - 259V<br>P2 - 258V<br>P3 - 282V | Operational |
| 4 | By sensor (when an artificial fault was created) | P1 - 109V<br>P2 - 242V<br>P3 - 100V | Warning: Fault at Phase - A |
| 5 | By sensor (when the created artificial fault was cleared) | P1 - 259V<br>P2 - 258V<br>P3 - 282V | Operational |
| 6 | By sensor (when an artificial fault was created) | P1 - 243V<br>P2 - 106V<br>P3 - 101V | Warning: Fault at Phase - C |
| 7 | By sensor (when the created artificial fault was cleared) | P1 - 258V<br>P2 - 257V<br>P3 - 282V | Operational |
| 8 | by operator (+Line) | P1 - 259V<br>P2 - 257V<br>P3 - 283V | Operational |
| 9 | by operator (+Line) | P1 - 260V<br>P2 - 259V<br>P3 - 285V | Operational |
| 10 | by operator (+Line) | P1 - 259V<br>P2 - 258V<br>P3 - 283V | Operational |

FIG. 10

GSM/GPRS BASED METHOD, SYSTEM AND COMPUTER PROGRAMS TO DETERMINE AND LOCATE HIGH IMPEDANCE FAULTS ON MEDIUM VOLTAGE DISTRIBUTION NETWORKS IN HIGH RESISTIVITY

RELATED APPLICATION

This application is related to, and claims priority to, U.S. Provisional Patent Application Ser. No. 61/701,643, filed on Sep. 15, 2012, the disclosure of which is incorporated herein by reference in its entirety.

TECHNICAL FIELD

Embodiments of the present claimed invention relate generally to the field of detecting one or more broken or open conductor faults in a medium voltage (MV) distribution network. In more particular aspects, embodiments of the present claimed invention relate to a global system for mobile (GSM) and/or a general packet radio service (GPRS) communication-based system for detecting broken or open faults in an inland area that has high resistivity, such as an inland desert area.

BACKGROUND

Downed conductor lines pose a serious hazard to people, animals, and the environment. Downed conductor lines can occur when an energized conductor line comes in contact with a quasi-insulating object, such as a tree, structure or equipment, or the ground. Such an event often causes arcing and flashing at the point of contact.

Even more problematic is the detection of such faults in an area that has high ground resistance, such as a desert location. When an energized conductor line falls to the ground in an area with a high ground resistance, such as sand, the fault current of the downed conductor lines is substantially zero due to the extremely high ground resistivity values. Conventional methods of measuring fault detections rely, for example, on source-side signal processing of currents and/or voltage, and are unable to detect high impedance faults in high ground resistance areas. Applicant has recognized the foregoing problems and limitations in the field and provides various embodiments to detect downed conductor lines in high ground resistance areas.

SUMMARY

Embodiments of the invention generally relate to GSM/GPRS communication-based voltage detection systems, methods, computer-readable media, and computer programs providing load-side processing of supply voltage and communicating the information to a base station, so that corrective measures can be taken to repair the broken or open conductor faults in a MV distribution network.

In particular, in accordance with at least one embodiment, the systems, methods, computer-readable media, and computer programs monitor a voltage at a low-voltage (LV) side of a distribution transformer. The measured voltage is transmitted, using, for example, GSM/GPRS communication to the base station and subsequent corrective measures are performed to address the broken or open conductor faults on the MV distribution network.

Furthermore, embodiments of the invention include systems, methods, computer-readable media, and computer programs to determine and locate one or more faults in the MV distribution network in a high resistivity area. Embodiments of the present invention include, for example, a plurality of open conductor devices, whereby each open conductor device is connected on a LV side of a respective distribution transformer and to a lateral end of a respective low voltage conduct line. According to various embodiments, each of the plurality of the open conductor device is configured to, for example, determine abnormal voltage readings and communicate such readings to the master station over the communication network, such as the GSM/GPRS communication-based network, as a non-limiting example. The master station, in accordance with various embodiments of the invention, is configured to determine or verify the presence of one or more faults on the distribution network and the location of the one or more faults.

In accordance with an embodiment of the present claimed invention, there is provided a system to detect and locate broken or open conductor faults associated with a medium voltage distribution network positioned to distribute electric power to areas with high resistivity. The system includes a voltage distribution network configured to distribute electric power to areas that have high resistivity. The voltage distribution network includes a plurality of high voltage conductor lines, each having a common node, and a plurality of low voltage conductor lines. The system further includes a plurality of distribution transformers. Each of the plurality of distribution transformers includes an upper portion connected to one or more of the plurality of high voltage conductor lines. Each of the plurality of distribution transformers is configured to reduce one or more first voltages received by the one or more of the plurality of high voltage conductor lines to one or more second voltages that are lower than the one or more first voltages. Each of the plurality of distribution transformers further includes a bottom portion connected to one or more of the plurality of low voltage conductor lines to distribute the one or more second voltages thereto from a respective one or more of the plurality of distribution transformers. The system further includes a plurality of open conductor devices. Each of the plurality of open conductor devices is connected on a low voltage side of a respective distribution transformer and to a lateral end of a respective low voltage conductor line that is connected to the bottom portion of the respective distribution transformer. Each of the plurality of open conductor devices is configured to communicate a plurality of voltage readings to a master station via a global system for mobile (GSM) communication network.

Each of the plurality of open conductor devices includes a power supply configured to supply power to the plurality of open conductor devices. The power supply includes a voltage transformer and a rectifier circuit. Each of the plurality of open conductor devices further includes a battery charging unit configured to charge a direct current (DC) battery as backup power supply, and a GSM module configured to facilitate communication with the GSM communication network. Each of the plurality of open conductor devices further includes a voltage sensing module configured to sense voltages of the plurality of low voltage conductor lines, and one or more microcontroller boards connected to the GSM communication network interface and configured to store a plurality of voltage loads of the plurality of low voltage conductor lines sensed by the voltage sensing module and to communicate the plurality of voltage loads using the GSM communication.

The system further includes one or more servers positioned remote from the plurality of open conductor devices and in proximity to a substation to define the master station. The master station determines a location of one or more broken or open conductor faults on the voltage distribution network.

The master station includes one or more processors, one or more subscriber identification modules configured to facilitate communication with the GSM communication network, and one or more non-transitory computer-readable mediums encoded with one or more computer programs operable with the one or more processors to determine the location of the one or more broken or open conductor faults on the voltage distribution network.

The computer program includes the instructions of constructing a plurality of voltage distribution topology lookup tables for the voltage distribution network. The plurality of lookup tables includes a topology of each of the plurality of high voltage conductor lines, each of the plurality of low voltage conductor lines, and each pathway to a common connection point via the plurality of high voltage conductor lines, the plurality of open conductor devices, and the plurality of low voltage conductor lines. The computer program further includes the instructions of determining, responsive to receiving a plurality of first voltage loads from the plurality of low voltage conductor lines over a predetermined period of time from the plurality of open conductor devices, a baseline voltage for each of the plurality of low voltage conductor lines. The computer program further includes determining receipt of a plurality of second voltage loads that is at least a predetermined difference lower than the baseline voltage for the plurality of low voltage conductor lines. The plurality of second voltage loads being communicated from at least two of the plurality of open conductor devices via the GSM communication network to thereby define a plurality of fault detected conductor devices. Further, the computer program includes the instructions of identifying, responsive to the plurality of voltage distribution topology look up tables, each pathway that is shared by each of the plurality of fault detected conductor devices and the common connection point based on the plurality of voltage distribution topology lookup tables, and identifying, responsive to identifying each pathway that is shared, two of the plurality of fault detected conductor devices that are positioned furthermost downstream from the common connection point, a location of a broken or open conductor fault being in proximity to one or more of the plurality of high voltage conductor lines connected between the two of the plurality of fault detected conductor devices.

In accordance with an embodiment, the plurality of first and second voltage loads include at least one of a plurality of line voltages and a plurality of phase voltages from the plurality of low voltage conductor lines.

In accordance with an embodiment, the plurality of open conductor devices is configured to determine that the plurality of second voltages loads is not below the predetermined difference lower than the baseline voltage for the plurality of low voltages conductor lines, and transmit one or more of the plurality of second voltage loads to the master station at predetermined intervals.

In accordance with an embodiment, the plurality of open conductor devices is configured to determine that the plurality of second voltage loads is at least the predetermined difference lower than the baseline voltage for the plurality of low voltages conductor lines, set an indicator indicating the low voltage conductor line having the plurality of second voltage loads determined to be the at least predetermined difference lower than the baseline voltage, and send one or more messages to the master station identifying the indicated low voltage conductor line and the plurality of second voltage loads.

In accordance with an embodiment, each of the plurality of open conductor devices further includes a battery switch circuit configured to prevent complete discharge the DC battery.

In accordance with an embodiment, the one or more microcontroller boards is further configured to execute one or more commands for the transmission and receipt of one or more messages from and to the plurality of open conductor devices.

In accordance with an embodiment of the present claimed invention, there is provided a system to detect one or more broken or open conductor faults on a medium voltage distribution network configured to distribute electric power to inland areas with high resistivity. The system includes a medium voltage distribution network configured to distribute electric power to inland areas that have high resistivity. The medium voltage distribution network includes a plurality of high voltage conductor lines, each having a common node, and a plurality of low voltage conductor lines. The system further includes a plurality of distribution transformers configured to reduce one or more first voltages received by one or more of the plurality of high voltage conductor lines connected to an upper portion of the plurality of distribution transformers to one or more second voltages that are lower than the one or more first voltages. Each of the plurality of distribution transformers further includes a bottom portion connected to one or more of the plurality of low voltage conductor lines to distribute the one or more second voltages thereto. Further, the system includes a plurality of open conductor devices. Each of the plurality of open conductor devices is connected on a low voltage side of a respective distribution transformer and to a lateral end of a respective low voltage conductor line that is connected to the bottom portion of the respective distribution transformer. Each of the plurality of open conductor devices is configured to communicate a plurality of voltage readings to a master station via a global system for mobile (GSM) communication network.

Each of the open conductor devices includes a power supply configured to supply power to the plurality of open conductor devices. The power supply includes a voltage transformer and a rectifier circuit. Each of the open conductor devices further includes a battery charging unit configured to charge a DC battery to be used as backup power supply, and a GSM communication network interface configured to facilitate communication with the GSM communication network. Further, each of the open conductor devices includes one or more microcontroller boards connected to the GSM communication network interface via a serial link, and a voltage sensing module configured to sense voltages of the plurality of low voltage conductor lines.

The system further includes one or more servers positioned remote from the plurality of open conductor devices and further near a substation to define the master station, the master station configured to determine a location of a broken or open conductor fault on the medium voltage distribution network. The master station includes one or more processors, one or more subscriber identification modules configured to facilitate communication with the GSM communication network, and one or more non-transitory computer-readable mediums encoded with one or more computer programs operable to determine the location of the broken or open conductor faults on the medium voltage distribution network.

The computer program includes the instructions of creating a plurality of lookup tables comprising a topology of the medium voltage distribution network. The plurality of lookup tables includes a topology of each of the plurality of high voltage conductor lines, each of the plurality of low voltage conductor lines, and each pathway to a common connection point via the plurality of high voltage conductor lines, the plurality of open conductor devices, and the plurality of low voltage conductor lines. The computer program further includes the instructions of gathering a plurality of voltage loads of the plurality of low voltage conductor lines over a predetermined period of time from the plurality of open conductor devices, and determining a baseline voltage for each of the plurality of low voltage conductor lines, when there is no broken or open conductor fault on the medium voltage distribution network, the baseline voltage being based on the gathered plurality of first voltage loads. Further, the computer program includes the instructions of determining a receipt of a plurality of second voltage loads that are at least a predetermined difference lower than the baseline voltage for the plurality of low voltage conductor lines. The plurality of second voltage loads is communicated from at least two of the plurality of open conductor devices using the GSM communication network to thereby define a plurality of fault detected conductor devices. The computer program further includes the instructions of identifying, responsive to the plurality of lookup tables, each pathway that is shared by each of the plurality of fault detected conductor devices and the common connection point based on the plurality of the lookup tables, and identifying, responsive to identifying each pathway that is shared, two of the plurality of fault detected conductor devices that are positioned furthermost downstream from the common connection point, a location of a broken or open conductor fault being on one or more of the plurality of high voltage conductor lines connected between the two of the plurality of fault detected conductor devices.

In accordance with an embodiment, the plurality of first and second voltage loads include at least one of a plurality of line voltages and a plurality of phase voltages from the plurality of low voltage conductor lines.

In accordance with an embodiment, the plurality of open conductor devices is configured to determine that the plurality of second voltages loads is not below the predetermined difference lower than the baseline voltage for the plurality of low voltages conductor lines, and transmit one or more of the plurality of second voltage loads to the master station at predetermined intervals.

In accordance with an embodiment, the plurality of open conductor devices is configured to determine that the plurality of second voltage loads is at least the predetermined difference lower than the baseline voltage for the plurality of low voltages conductor lines, set an indicator indicating the low voltage conductor line having the plurality of second voltage loads determined to be the at least predetermined difference lower than the baseline voltage, and send one or more messages to the master station identifying the indicated low voltage conductor line and the plurality of second voltage loads.

In accordance with an embodiment, each of the plurality of open conductor devices further includes a battery switch circuit configured to prevent complete discharge the DC battery.

In accordance with an embodiment, the one or more microcontroller boards is further configured to execute one or more commands for the transmission and receipt of one or more messages from and to the plurality of open conductor devices.

BRIEF DESCRIPTION OF THE DRAWINGS

So that the manner in which the features and benefits of the invention, as well as others which will become apparent, may be understood in more detail, a more particular description of the embodiments may be had by reference to the embodiments thereof which are illustrated in the appended drawings, which form a part of this specification. It is also to be noted, however, that the drawings illustrate only various embodiments of the invention and are therefore not to be considered limiting of the invention's scope as it may include other effective embodiments as well.

FIG. 10 is sample data of voltage readings by the plurality of open conductor devices, in accordance with various embodiments of the invention.

Figure 1:
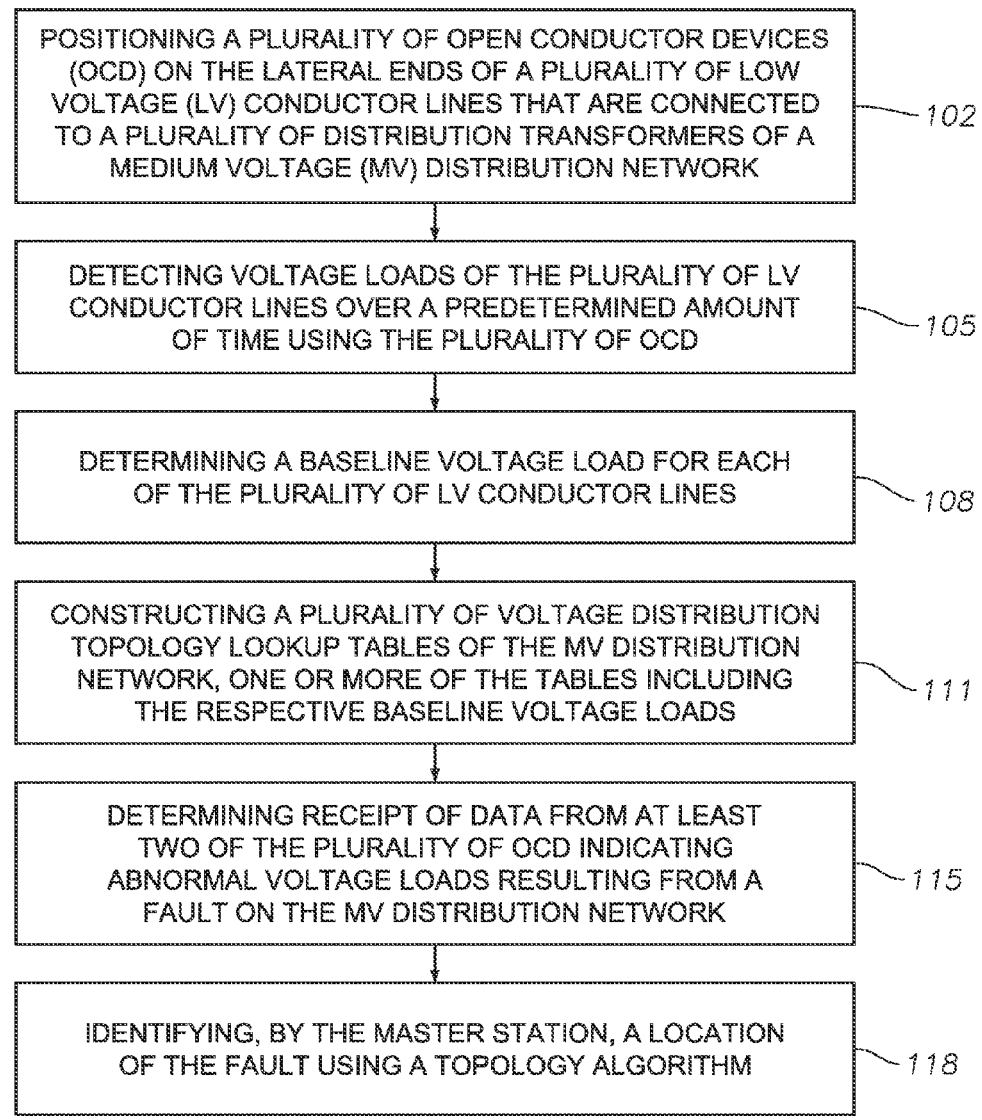
FIG. 1 is a flow chart of an overview of detecting and locating broken or open conductors in a MV distribution network, in accordance with various embodiments of the invention.

While the invention is susceptible to various modifications and alternative forms, specific embodiments thereof are shown by way of example in the drawings and will herein be described in detail. In the drawings and description that follow, like parts are marked throughout the specification and drawings with the same reference numerals, respectively. Prime notation, if used, indicates similar elements in alternative embodiments. The drawings are not necessarily to scale. Certain features of the disclosure may be shown exaggerated in scale or in somewhat schematic form and some details of conventional elements may not be shown in the interest of clarity and conciseness. It should be understood, however, that the drawings and detailed description thereto are not intended to limit the invention to the particular form disclosed, but to the contrary, the intention is to cover all modifications, equivalents, and alternatives falling within the spirit and scope of the present invention as defined by the appended claims.

DETAILED DESCRIPTION

The present invention will now be described more fully hereinafter with reference to the accompanying drawings, which illustrate various embodiments of the invention. This invention, however, may be embodied in many different forms and should not be construed as limited to the embodiments set forth herein. Rather, these embodiments are provided so that this disclosure will be thorough and complete, and will fully convey the scope of the invention to those skilled in the art. It is to be fully recognized that the different teachings of the various embodiments discussed below may be employed separately or in any suitable combination to produce desired results. The various characteristics mentioned above, as well as other features and characteristics described in more detail below, will be readily apparent to those skilled in the art upon reading the following detailed description of the various embodiments, and by referring to the accompanying drawings.

Embodiments of the present invention provide systems, methods, and computer programs encoded on computer-readable mediums to detect and locate broken or open conductor faults in a MV distribution network 200. Power transmission and distribution systems are vital links that produce continuity of services from generating stations to one or more far end users. Overhead feeder conductors are prone to physical contact with neighboring objects, such as trees, buildings, or the surface below them, as non-limiting examples. The detection of open or broken conductor lines can pose serious health and environmental risks. High impedance faults resulting from broken or downed conductor lines often result in arching or other fire hazards. The detection of such faults is especially problematic in high ground resistivity areas, such as desert lands, because the fault current is at or substantially near zero, and therefore not detected by conventional power system protection devices.

Figure 2:
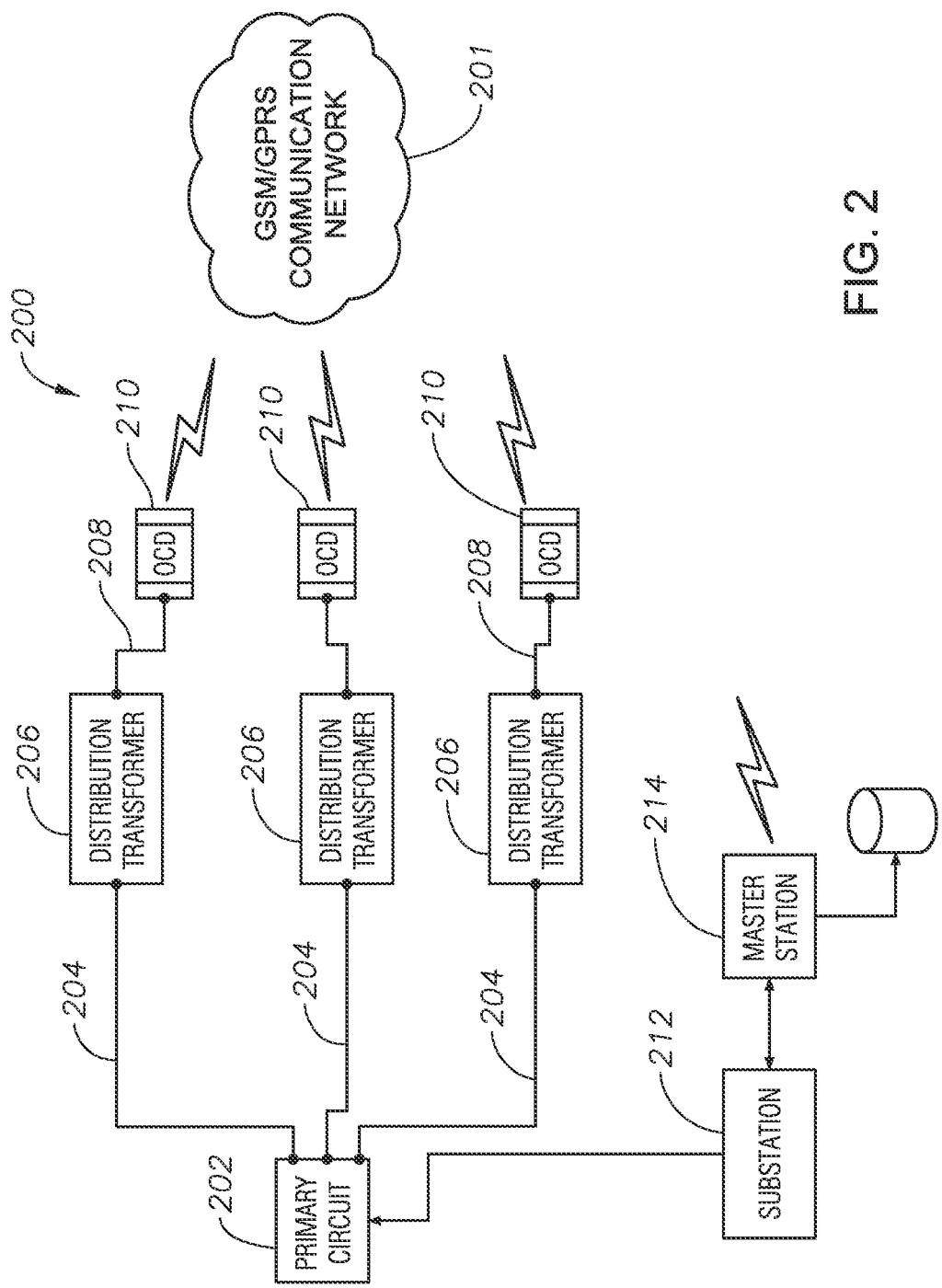
FIG. 2 is a schematic block diagram of a system for detecting and locating broken or open conductors in a MV distribution network, in accordance with various embodiments of the invention.

In view of the foregoing, embodiments of the invention provide systems, methods, and computer programs encoded on computer-readable mediums to detect and locate broken or open conductor faults in the MV distribution network 200 in a high resistivity area. As illustrated in FIG. 2, the MV distribution network 200, in accordance with various embodiments of the present invention, includes a primary circuit 202 connected to a substation 212, as understood by those of ordinary skill in the art. In accordance with various embodiments, the MV distribution network 200 further includes a master station 214 in communication with the substation 212 and having one or more computer programs, non-transitory memory, and other hardware operable to facilitate the detection and location of one or more broken or open conductors. The master station 214, in accordance with the embodiments of the present invention, includes one or more subscriber identity module cards to enable the master station 214 to communicate over a communication-based network 201, for example, a GSM/GPRS communication network, as a non-limiting example. Other types of communication networks are contemplated by the embodiments of the present invention.

According to various embodiments of the present invention, the MV distribution network 200 further includes a plurality of high-voltage (HV) conductor lines 204 adapted to distribute power from the primary circuit 202 to a plurality of distribution transformers 206. As understood by those skilled in the art, each of the plurality of distribution transformer 206, according to certain embodiments, is configured to reduce the HV line voltage of a respective HV conductor line 204 to a LV, as required for the needs of the end-user customers. Each of the HV conductor lines 204 is positioned overhead and connected, for example, to an upper portion of a respective distribution transformer 206 mounted on, for example, a pole, for example, to receive the HV line voltage and to reduce the HV line voltage to an appropriate LV line voltage, as required by the needs of the end-user customer.

In further embodiments of the claimed invention, each distribution transformer 206 is also connected to a respective LV conductor line 208, so that after reducing or stepping down the HV to the LV, such LV is adapted to be transported to one or more end-user customers, as understood by those skilled in the art. Each of the LV conductor lines 208, in accordance with various embodiments of the invention, is connected, for example, to a bottom end portion of a respective distribution transformer 206. In accordance with at least one embodiment, a plurality of open conductor devices 210 is connected on the LV side of the respective distribution transformer 206 and to a lateral end of a respective LV conductor line 208.

Figure 6A:
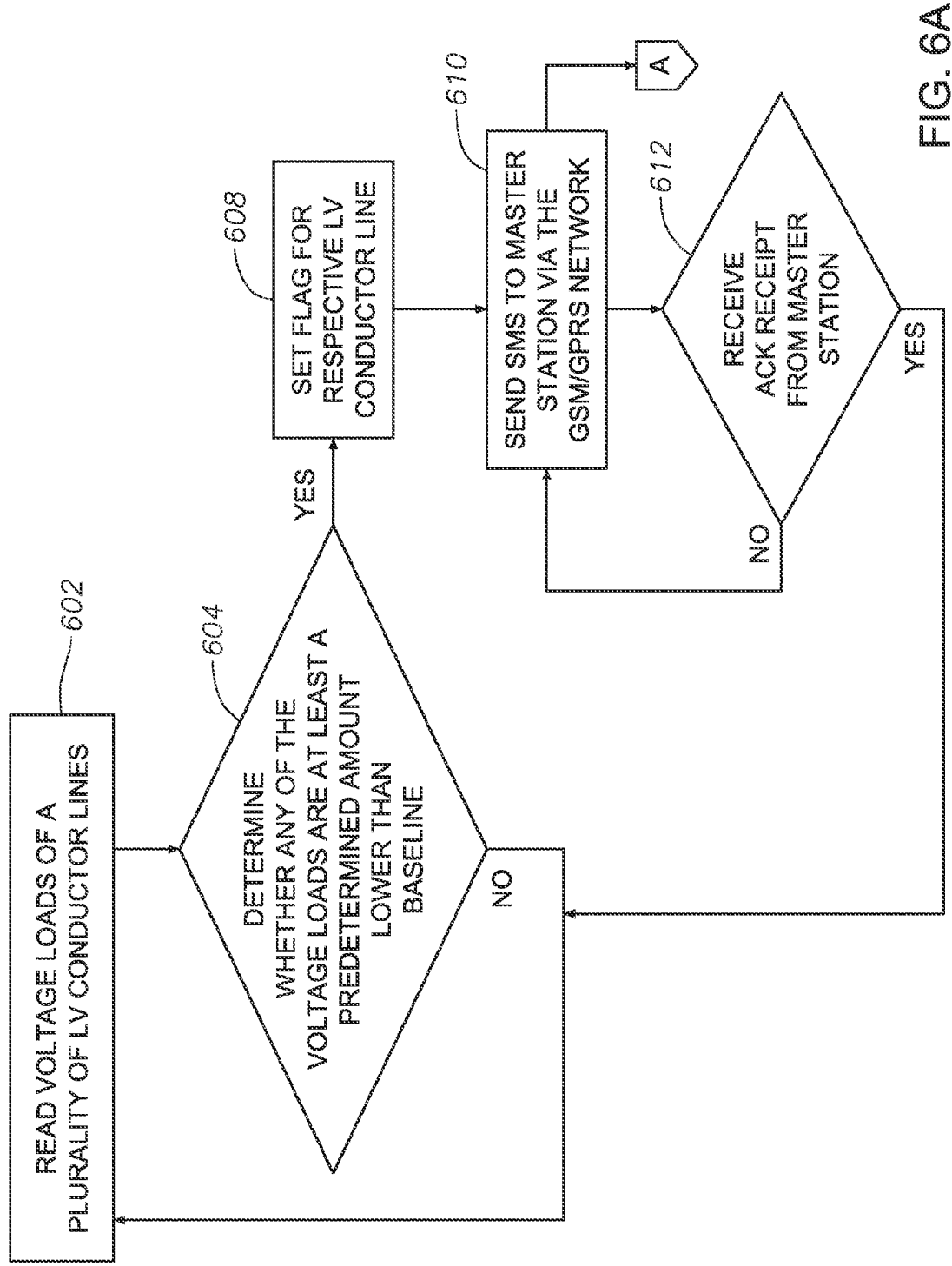
FIGS. 6 A and B are flow charts of monitoring voltage readings by the plurality of open conductor devices, in accordance with various embodiments of the invention.

In accordance with various embodiments, each of the plurality of open conductor devices 210 is configured to detect the voltage load of the respective LV conductor line 208 (block 602) and communicates the detected voltage load to the master station 214 thru the GSM/GPRS communication network 201 (see, e.g., FIGS. 6A and 6B). In accordance with at least one embodiment, the detected voltage load includes at least one of a line voltage and a phase voltage of the LV conductor line 208. As illustrated in FIGS. 6A and 6B, in some embodiments, the plurality of open conductor devices 210 is further configured to determine whether any of the detected voltage loads is at least a predetermined amount lower than a respective baseline (block 604). In certain embodiments, as illustrated in FIG. 6B, when the detected voltage loads are not at or below the predetermined amount of the baseline, then the plurality of open conductor devices 210 is further configured to send one or more of the detected voltage loads to the master station 214 at predetermined intervals (block 606). In some embodiments, as shown in both FIGS. 6A and 6B, when the detected voltage loads are at or below the predetermined amount of the baseline voltage load, then the plurality of open conductor devices 210 is configured to set a flag for the respective LV conductor line 208 (block 608) and send one or more messages, for example, a short message service (SMS), as a non-limiting example, via the GSM/GPRS network 201 to the master station 214 (block 610). In accordance with various embodiments, if one or more of the plurality of open conductor devices 210 has not received an acknowledgement of the one or more transmitted SMS, a subsequent SMS may be sent at predetermined intervals (e.g., every five minutes, as a non-limiting example) until such acknowledgement receipt from the master station 214 is received, for example (block 612). Sample voltages detected by a plurality of open conductor devices OCD 210 on the MV distribution network 200 in a high resistivity area, in accordance with certain embodiments of the present invention, are illustrated in FIG. 10, for example.

In accordance with at least one embodiment, as shown in FIG. 6A, when the detected voltage loads are not at or below the predetermined amount of the baseline, then the plurality of open conductor devices 210 is further configured to continue reading, at predetermined intervals (e.g., every five minutes, as a non-limiting example), the voltage loads of the plurality of LV conductor lines 208, without communicating the results to the master station 214.

Figure 4:
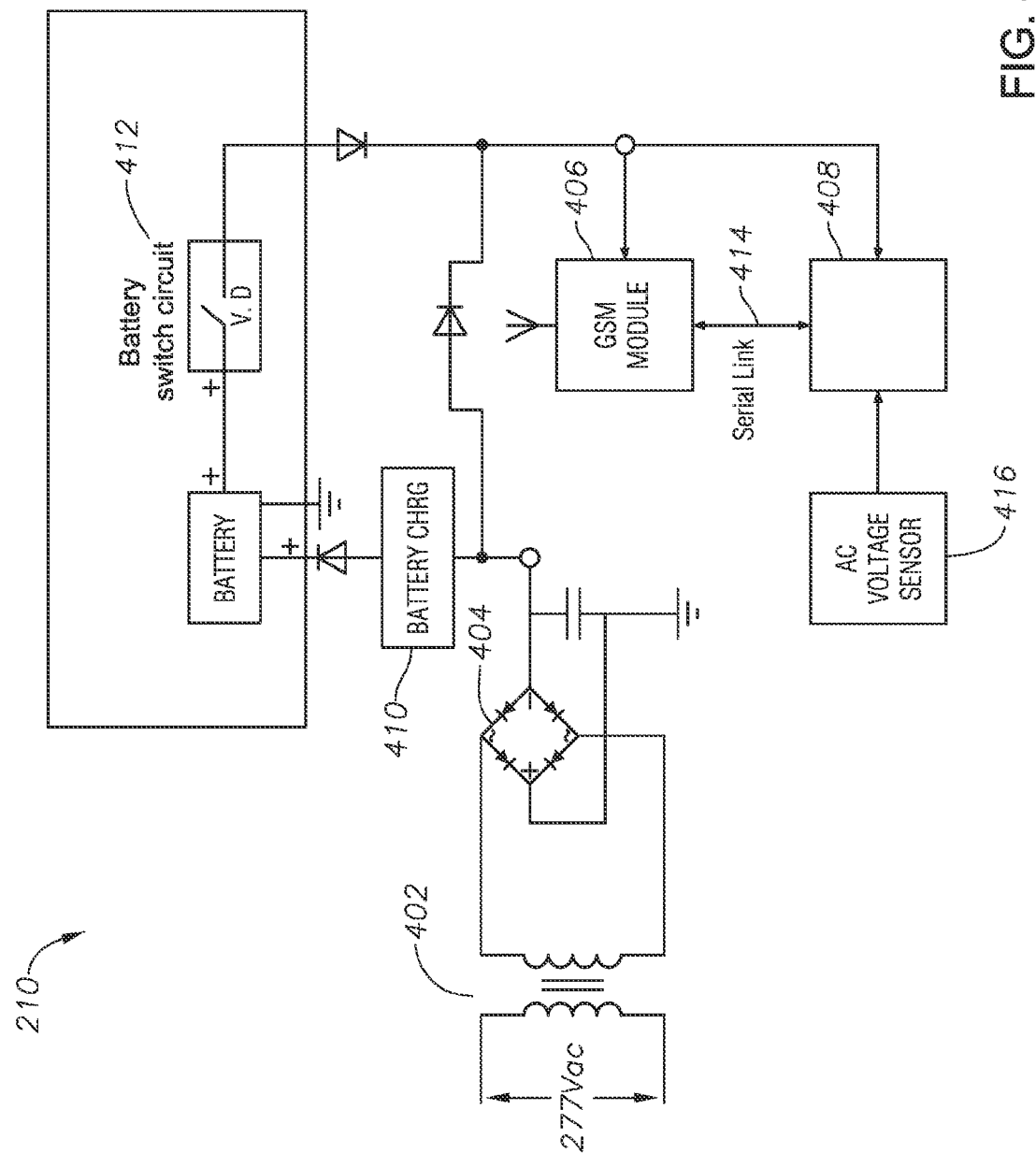
FIG. 4 is a schematic blow diagram of an open conductor device, in accordance with various embodiments of the invention.
Figure 5:
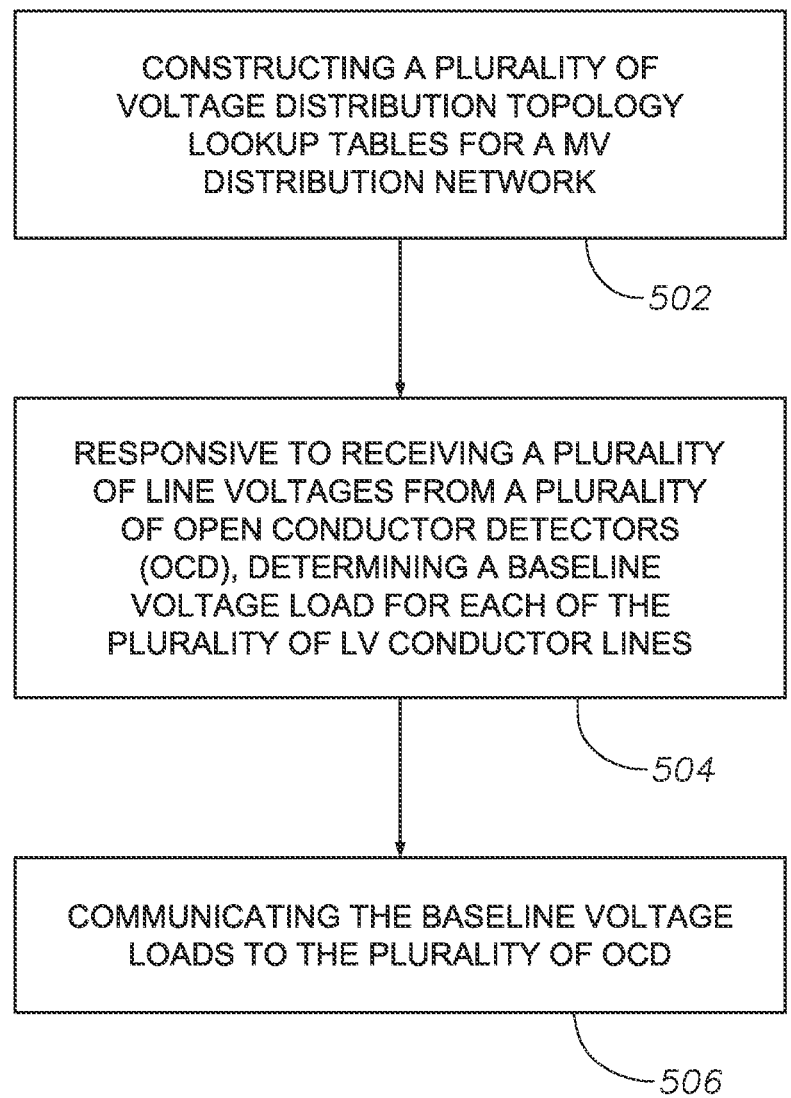
FIG. 5 is a flow chart of creating baseline voltages for a plurality of conductor lines, in accordance with various embodiments of the invention.

In accordance with various embodiments, each of the plurality of open conductor devices 210 includes various hardware and software components. For example, as illustrated by FIG. 4, each of the plurality of open conductor devices 210 includes one or more transformers 402 to supply one or more AC voltages to one or more rectifier circuits 404. The one or more rectifier circuits 404 is adapted to output one or more DC voltages that are preferably higher than the supplied AC voltages. As understood by those skilled in the art, the output of the one or more rectifier circuits 404 is fed to one or more voltage regulators (not illustrated), one or more GSM modules 406, one or more microcontrollers 408, and one or more battery charging circuits 410. Various embodiments of the invention further provide that the plurality of open conductor devices 210 includes the one or more GSM modules 406, which are each configured to facilitate communication between an open conductor device 210 and the GSM/GPRS communication network 201.

According to certain embodiments, each of the plurality of open conductor devices 210 further includes one or more battery switching circuits 412 that is configured to prevent complete discharge of the one or more batteries. In accordance with at least one embodiment, each of the plurality of open conductor devices 210 opens up the one or more battery switching circuits 412, when relay contacts of the one or more batteries drops below a predetermined level. The one or more battery switching circuits 412, in accordance with various embodiments of the present invention, advantageously prevents complete discharge of the one or more batteries and will also help increase the life of the one or more batteries.

The one or more microcontrollers 408, as understood by those skilled in the art, are connected to the one or more GSM modules 406 via one or more serial links 414. The one or more microcontrollers 408, in accordance with certain embodiments, are configured to determine baseline voltages for each of the plurality of LV conductor lines 208. The one or more microcontrollers 408, in accordance with various embodiments of the present invention, are also configured to store baseline readings and a plurality of voltage readings detected by the one or more voltage sensors 416 and to communicate data using the one or more GSM modules 406. The one or more microcontrollers 408 are further configured to execute diagnostic software to detect the one or more faults.

In accordance with certain embodiments, the one or more microcontrollers 408 execute one or more commands to facilitate the receipt and transmission of the SMS. For example, the one or more microcontrollers 408 execute a read command, for example, a CPBR command, as understood by those skilled in the art, to determine the maximum number of entries the open conductor device 210 can contain and the maximum length of phone numbers, email addresses, and names. Moreover, the one or more microcontrollers 408 execute a storage command, for example, a CPMS command, as understood by those skilled in the art, to select the message storage area that will be used when sending, receiving, reading, writing, or deleting SMS messages. Furthermore, the one or more microcontrollers 408 execute a verification command, for example, a CIND command, as understood by those skilled in the art, to check the status or the communication link to the master station 214.

In accordance with an embodiment, the one or more microcontrollers 408 are programmed to take a digital image of an AC voltage, for example, a 60 Hz rectified AC voltage at a sampling rate of 436 μs per reading. The peak value of the sample is taken during each half cycle after every zero crossing. The peak values obtained are scaled out and sent to the master station 214 via SMS with a warning message of a possible fault on the MV distribution network 200.

In one example, calculated line voltage values for a Dyn distribution transformer were measured (see Table 1):

TABLE 1

Calculated line voltage values for a Dyn distribution transformer

| No | Condition on MV primary feeder | $V_{out}$ (Line voltages) | | |
|---|---|---|---|---|
| | | $V_{ab}$ | $V_{bc}$ | $V_{ca}$ |
| 1 | Normal | 220/0° | 220/120° | 220/240° |
| 2 | Conductor-A broken | 0 | 190.7/90° | 190.7/270° |
| 3 | Conductor-B broken | 190.7/30° | 0 | 190.7/210° |
| 4 | Conductor-C broken | 190.7/330° | 190.7/150° | 0 |

In another example, calculated phase voltages for the Dyn distribution transformer were measured (see Table 2):

TABLE 2

Calculated phase voltage values for the Dyn distribution transformer

| No | Condition on MV primary feeder | $V_{out}$ (Phase voltages) | | |
|---|---|---|---|---|
| | | $V_{an}$ | $V_{bc}$ | $V_{ca}$ |
| 1 | Normal | 127/30° | 127/150° | 127/270° |
| 2 | Conductor-A broken | 63.5/90° | 63.5/90° | 127/270° |
| 3 | Conductor-B broken | 127/30° | 63.5/210° | 63.5/210° |
| 4 | Conductor-C broken | 63.5/330° | 127/150° | 63.5/330° |

Figure 3:
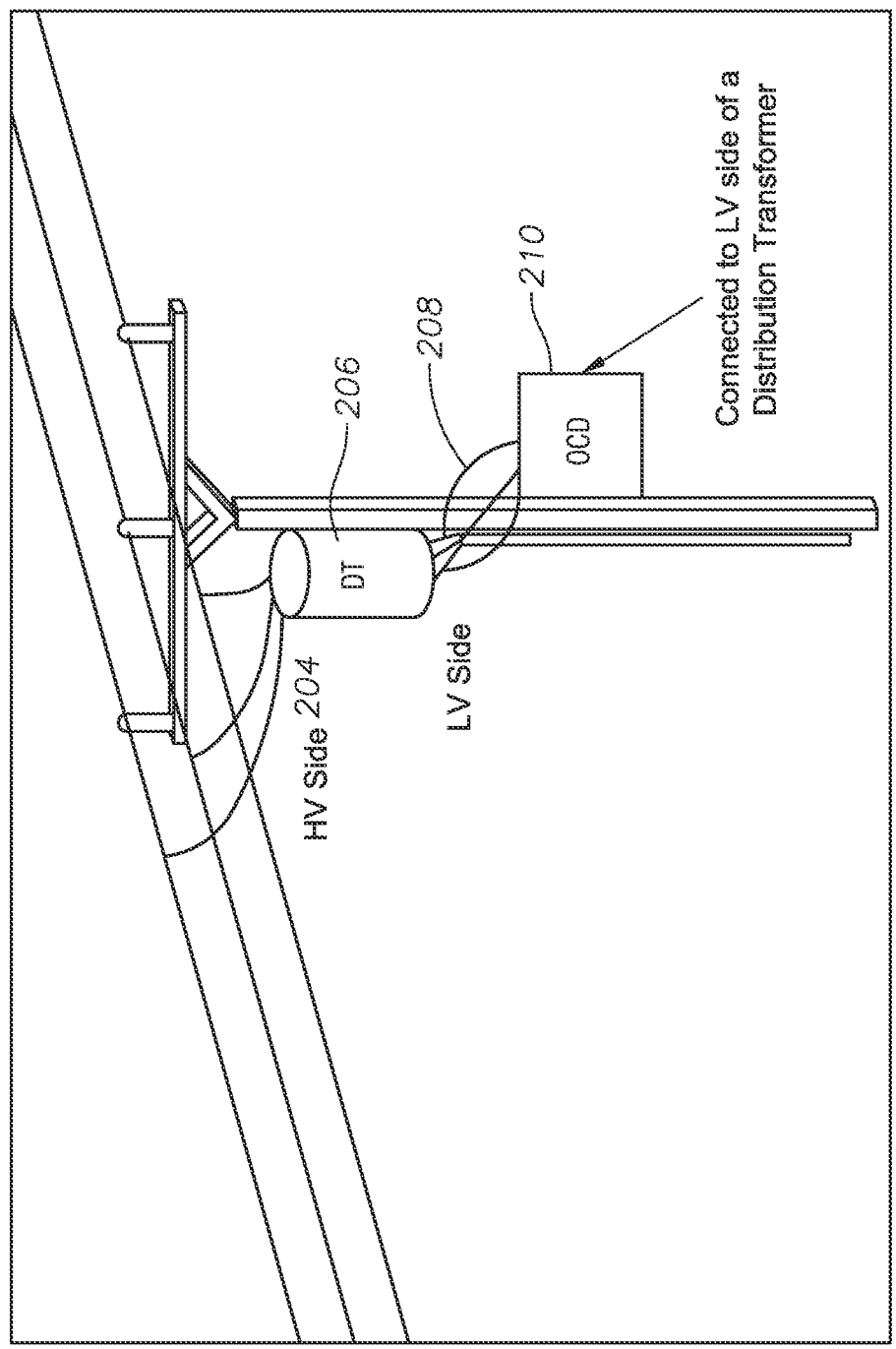
FIG. 3 is an illustration of the positioning and connections of an open conductor device, in accordance with various embodiments of the invention.

In accordance with various embodiments, there is provided a method for detecting and locating broken or open conductor faults. As illustrated in FIG. 1, the method, according to various embodiments of the present invention, includes positioning a plurality of open conductor devices 210 on one or more lateral ends of a plurality of LV conductor lines 208 that are connected to a plurality of distribution transformers 206 (block 102). The method further includes positioning one or more of the plurality of open conductor devices 210 on one or more bottom ends of the plurality of distribution transformers 206. The positioning and connection of the plurality of distribution transformers 206 and the plurality of open conductor devices 210, in accordance with certain embodiments of the present invention, are illustrated in FIG. 3, for example.

In accordance with at least one embodiment, the method further includes the step or instruction of detecting the voltage loads of the plurality of LV conductor lines 208 over a predetermined amount of time using the plurality of open conductor devices 210, when a broken or downed conductor line is not present on the MV distribution network 200 (block 105). As noted above, the detected voltage loads include at least one of a line voltage and a phase voltage of the LV conductor lines 208. After detecting the voltage loads over the predetermined amount of time, a baseline can be determined for each respective LV conductor line 208 or open conductor device 210 (block 108). According to various embodiments, as further shown in FIG. 1, the baseline voltage loads can be determined by the plurality of open conductor devices 210 and then communicated to the master station 214 over the GSM/GPRS communication network 201. In accordance with certain embodiments of the present invention, the baseline voltage loads can be determined by the master station 214 and subsequently communicated over the GSM/GPRS communication network 201 to the plurality of open conductor devices 210. In further embodiments, the baseline can be initially determined by the plurality of open conductor devices 210 and verified by the master station 214. As understood by those skilled in the art, the master station 214 stores or has access to historical data associated with the plurality of open conductor devices 210 and the plurality of LV conductor lines 208, and determines the baselines based on the readings from the plurality of open conductor devices 210 and the historical data.

Figure 8:
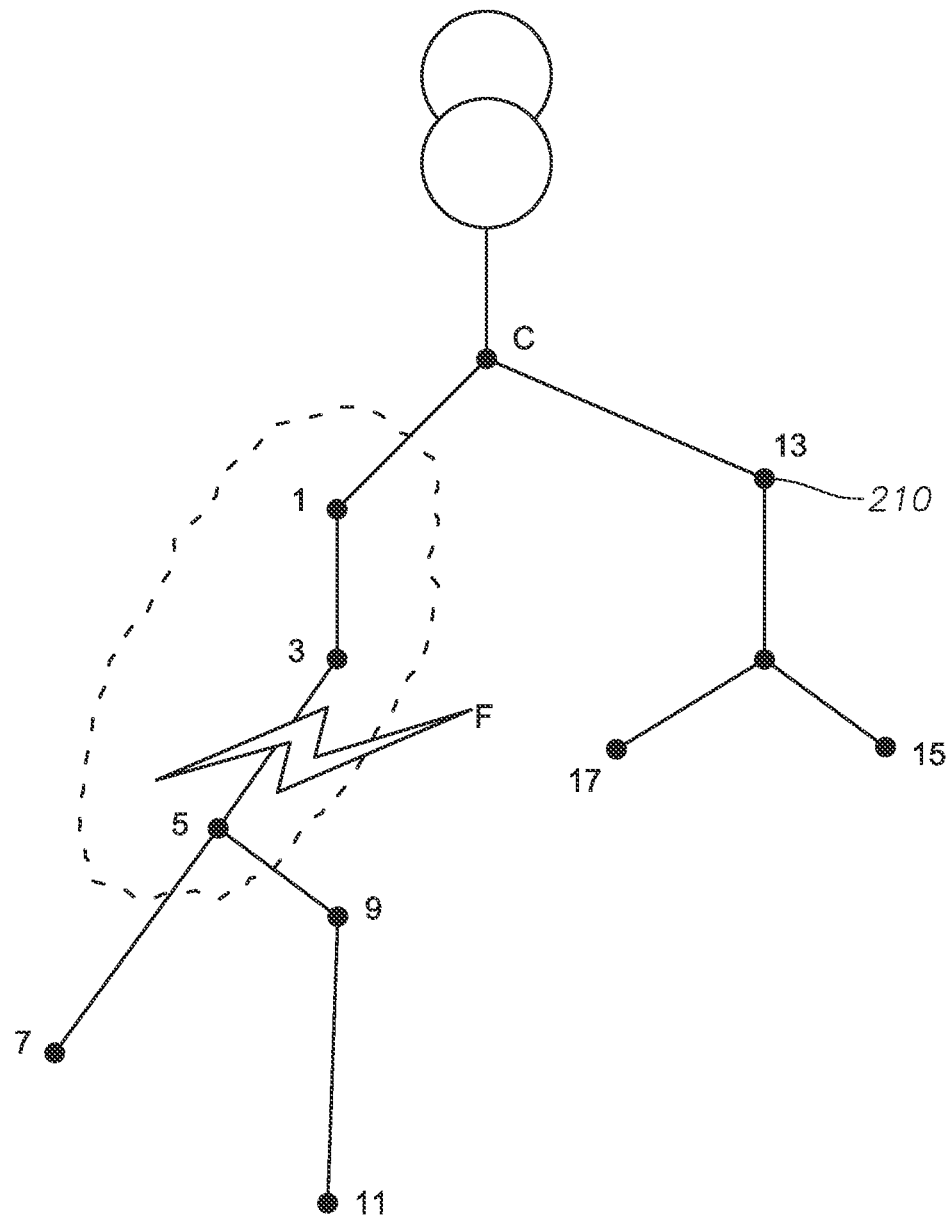
FIG. 8 is a schematic of a fault in a MV distribution network, in accordance with various embodiments of the invention.

In accordance with some embodiments, the method further includes the step or instruction of constructing a plurality of voltage distribution topology lookup tables, as understood by those skilled in the art (block 111). The plurality of topology lookup tables is constructed by one or more computer processors of the master station 214. The MV distribution network 200, according to various embodiments of the claimed invention, includes a plurality of elements, including but not limited to, a plurality of open conductor devices 210, a plurality of LV conductor lines 208, a plurality of distribution transformers 206, a plurality of HV conductor lines 204, one or more primary circuits 202, one or more master stations 214, and one or more substations 212. As understood by those skilled in the art, the power of the MV distribution network 200, in accordance with the various embodiments of the present invention, is provided by one or more single phase distribution transformers 206 or three-phase distribution transformers 206. In accordance with at least one embodiment, the plurality of topology lookup tables detail the interconnections of one or more of the foregoing elements of the MV distribution network 200. For example, the topology lookup tables indicate that a HV conductor line 204 is an overhead power line connected to an open conductor device 210 mounted on a pole and connected to a LV conductor line 208 (see. e.g., FIG. 3). According to various embodiments of the invention, the plurality of topology lookup tables further indicate a pathway and corresponding nodes for each of the plurality of LV conductor lines 208 to one or more common connection points C, as shown in FIG. 8. Even further, according to some embodiments of the present invention, the plurality of topology look tables indicate the pathway and corresponding nodes for each of the plurality of HV conductor lines 204 to one or more common connection points C, as further shown in FIG. 8. As will be understood by those skilled in the art, the plurality of topology lookup tables, according to various embodiments of the present invention, can be used to help localize a detected broken or open conductor or fault.

As further shown in FIG. 1, to facilitate the determination of a broken or open conductor or fault is on the MV distribution network 200, the plurality of open conductor devices 210, as discussed above, is configured to communicate one or more voltage load readings to the master station via the GSM/GPRS network 201. Upon receiving at least two abnormal voltage readings from at least two different open conductor devices 210, the master station 214, in accordance with embodiments of the claimed invention, analyzes the data to determine whether there is one or more broken or open conductor lines on the MV distribution network 200 (block 115). If the master station 214 determines that there is one or more broken or open conductor lines based on, for example, the received readings, historical data, or other diagnostic software or systems, then the master station 214 identifies one or more locations of the one or more broken or open conductor lines using a topology algorithm (block 118).

As illustrated in FIG. 8, in certain embodiments, each conductor line will have two nodes, a node downstream from a common connection point C and a second node upstream from the common connection point C. According to various embodiments of the present invention, each of the nodes are numbered or otherwise identified by an identifier and are connected to one or more of the plurality of open conductor devices 210. Such information, for example, may be stored and maintained by the master station 214 on one or more of the plurality of topology lookup tables. As will be understood by those skilled in the art, when one or more broken or open conductors or faults F occur on the MV distribution network 200, one or more of the plurality of open conductor devices 210 positioned downstream from the fault F will detect abnormal voltage readings and will report such readings to the master station 214. For example, FIG. 8 illustrates a fault F occurring between nodes 3 and 5, which are each connected to one or more of the plurality of open conductor devices 210. According to various embodiments, when such fault F occurs, each of the one or more of the plurality of open conductor devices 210 connected to nodes 5, 7, 9, and 11 will detect and report abnormal voltage readings (e.g., voltages at least a predetermined amount lower than a respective baseline). The one or more of the plurality of open conductor devices 210 connected to node 3 may also report abnormal voltage readings in accordance with some embodiments of the present invention. Each of the plurality of open conductor devices 210 that report abnormal voltage readings, in accordance with embodiments of the present invention, are sometimes referred to herein as "fault detected conductor devices".

Figure 7:
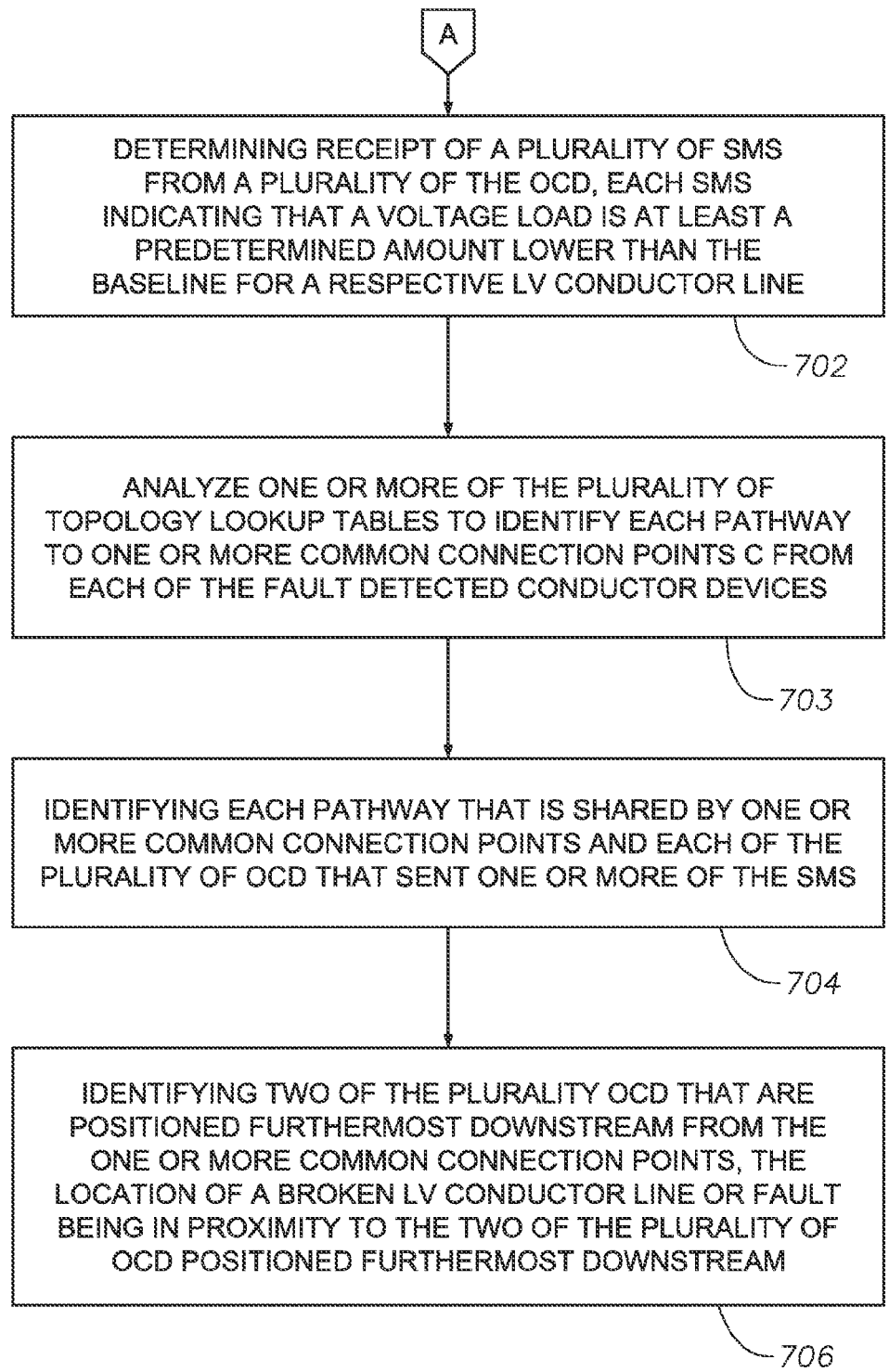
FIG. 7 is a flow chart of detecting and locating broken or open conductors in a MV distribution network by a master station, in accordance with various embodiments of the invention.

Upon the master station 214 receiving the abnormal voltage readings from each of the fault detected conductor devices (see, e.g., block 702 in FIG. 7), in accordance with embodiments of the present invention, the master station 214 executes one or more computer programs using one or more computer processors to analyze one or more of the plurality of topology lookup tables to identify each pathway to one or more common connection points C from each of the fault detected conductor devices (see, e.g., block 703 in FIG. 7). As understood by those skilled in the art, the master station 214 may receive flags representative of one or more abnormal voltage readings from one or more of the plurality of open conductor devices 210. Referring back to FIG. 8, the master station 214, in accordance with certain embodiments of the claimed invention, identifies (from, for example, downstream to upstream) the pathways between nodes: (5, 3, 1, C), (7, 5, 3, 1, C); (9, 5, 3, 1, C); and (11, 9, 5, 3, 1, C).

Next, in accordance with some embodiments of the present invention, the one or more computer programs executed by the master station 214 identifies the nodes common to all of the identified pathways. Referring again back to the illustration of FIG. 8, and the block diagram in FIG. 7, for example, nodes 5, 3, 1, and C are common between each of the pathways identified in the previous step, in accordance with various embodiments of the claimed invention (block 704). Accordingly, the master station 214, as understood by those skilled in the art, next identifies two of the nodes positioned furthermost downstream from the one or more common connection points C (block 706). The master station 214 also identifies each of the fault detected conductor devices connected to the two nodes positioned furthermost downstream from the one or more common connection points C. In FIG. 8, for example, such fault detected conductor devices would be those connected to nodes 3 and 5 because they are, in this sample illustration, the nodes positioned furthermost downstream on the identified pathway of 5, 3, 1, and C.

To identify the location of the detected fault F, in accordance with various embodiments of the present invention, the master station 214 analyzes one or more of the plurality of topology lookup tables to determine the one or more conductor lines connected to the two furthermost downstream nodes. As illustrated in FIG. 8, the fault F is located between the nodes 5 and 3. The master station 214 uses the location of nodes 5 and 3 to identify the conductor lines connected therebetween, for example.

The present invention contemplates various embodiments for determining one or more baseline voltages for each of a plurality of conductor lines. For example, determining baseline voltages can include the step of constructing a plurality of voltage distribution topology lookup tables for a MV distribution network 200 (see, e.g., block 502). Responsive to construction of the plurality of topology lookup tables, embodiments of the present invention further include a plurality of open conductor devices 210 detecting a plurality of voltage readings over a predetermined time. A master station 214, one or more of the plurality of open conductor devices 210, or both, are configured to analyze the detected voltage readings and determine a baseline for each conductor line (block 504). In accordance with at least one embodiment, each of the plurality of open conductor devices 210 determines initial baseline voltage loads and the master station 214 verifies and finalizes the baselines based on historical data. As understood by those skilled in the art, applying linear interpolation to the detected voltage load readings may be used to get a more accurate baseline. After the baseline voltage loads are determined, for example, they are communicated to the plurality of open conductor devices 210 (block 506). As understood by those skilled in the art, each of the plurality of open conductor devices 210 receive only the baseline voltage loads associated with the conductor lines connected thereto.

Figure 9:
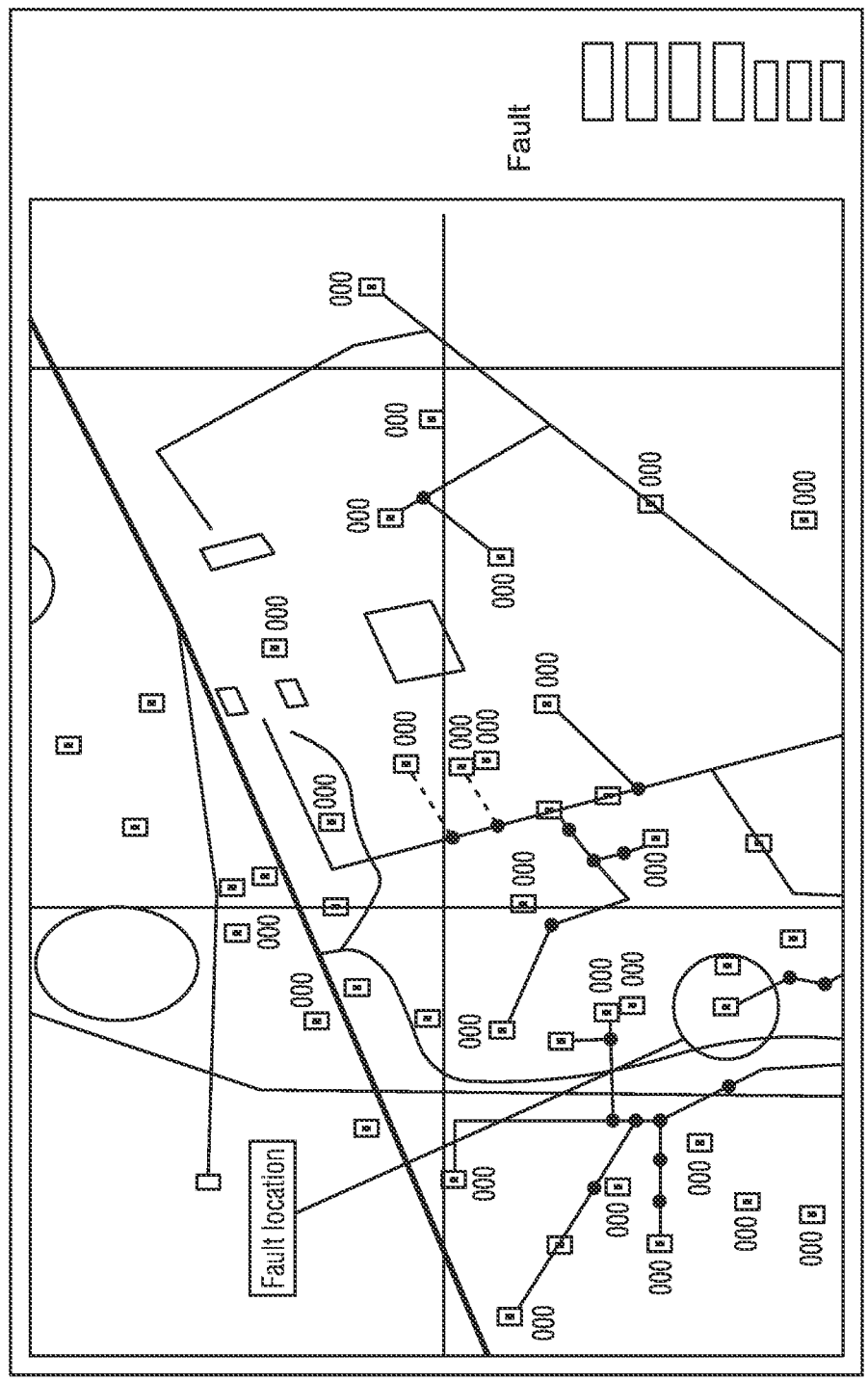
FIG. 9 is a screen shot of visual outputs of one or more computer programs operable to detect and locate faults, in accordance with various embodiments of the invention.

Embodiments of the present invention also include a graphical topology map, similar to the map illustrated in FIG. 9, that provides a visual representation of the topology of at least a part of the MV distribution network 200. FIG. 9 also illustrates visual outputs of one or more computer programs operable to detect and locate faults, in accordance with various embodiments of the claimed invention.

A number of implementations have been described. Nevertheless, it will be understood that various modifications may be made without departing from the spirit and scope of this disclosure. Accordingly, other implementations are within the scope of the claims. Various embodiments may further include receiving, sending, or storing instructions and/or data implemented in accordance with the foregoing description upon a computer-accessible medium. Generally speaking, a computer-accessible/readable storage medium may include non-transitory storage media, such as magnetic or optical media, (e.g., disk or DVD/CD-ROM); volatile or non-volatile media, such as RAM (e.g., SDRAM, DDR, RDRAM, SRAM, etc.), or ROM, as non-limiting examples.

Certain embodiments may be implemented, for example, on a computing device, such as a personal computer or mobile device, and various aspects described herein, such as modules, data repositories, dimension maps, and dimension profiles, for example, can be implemented within one or more commercially-available applications executed on the computing device. For example, various aspects described herein can be implemented on a personal computer executing applications provided by Microsoft Corporation of Redmond, Wash., such as .net, Microsoft Excel and Microsoft Access. Also, for example, various aspects described herein can be implemented on a personal computer executing other commercially-available database applications featuring data storage, calculation, graphing tools, pivot tables, and macro-programming capabilities, for example.

Further modifications and alternative embodiments of various aspects of the invention will be apparent to those skilled in the art in view of this description. Accordingly, this description is to be construed as illustrative only and is for the purpose of teaching those skilled in the art the general manner of carrying out the invention. It is to be understood that the forms of the invention shown and described herein are to be taken as examples of embodiments. Elements and materials may be substituted for those illustrated and described herein, parts and processes may be reversed or omitted, and certain features of the invention may be used independently, all as would be apparent to one skilled in the art after having the benefit of this description of the invention. Changes may be made in the elements described herein without departing from the spirit and scope of the invention as described in the following claims. Headings used herein are for organizational purposes only and are not meant to be used to limit the scope of the description.

As used throughout this application, the words "may" and "can" are used interchangeably and are used in a permissive sense (i.e., meaning having the potential to), rather than the mandatory sense (i.e., meaning must). The words "include", "including", and "includes" mean including, but not limited to. As used throughout this application, the singular forms of articles, such as "a," "an," and "the" include plural referents unless the content clearly indicates otherwise. Thus, for example, reference to "an element" includes a combination of two or more elements, and features attributed to that element may be features of each of the two or more elements or different elements of the two or more elements may each have different, potentially overlapping, subsets of the attributed features. Words related to numbering used herein—such as "primary," "secondary," "first," "second," "third" or other ordinal numbers—are merely descriptive and do not define or connote any specific order or degree of importance except as expressly qualified herein. Unless specifically stated otherwise, as apparent from the discussion, it is appreciated that throughout this specification discussions utilizing terms such as "constructing," "processing," "analyzing," "calculating," "determining," or the like refer to actions or processes of a specific apparatus, such as a special purpose computer or a similar special purpose electronic processing/computing device. In the context of this specification, a special purpose computer or a similar special purpose electronic processing/computing device is capable of manipulating or transforming signals, typically represented as physical electronic, optical, or magnetic quantities within memories, registers, or other information storage devices, transmission devices, or display devices of the special purpose computer or similar special purpose electronic processing/computing device.

That is claimed is:

1. A system to detect and locate broken or open conductor faults associated with a medium voltage distribution network positioned to distribute electric power to areas with high resistivity, the system comprising:
 a voltage distribution network configured to distribute electric power to areas that have high resistivity, the voltage distribution network comprising a plurality of high voltage conductor lines, each having a common node, and a plurality of low voltage conductor lines;
 a plurality of distribution transformers, each of the plurality of distribution transformers comprising an upper portion connected to one or more of the plurality of high voltage conductor lines and configured to reduce one or more first voltages received by the one or more of the plurality of high voltage conductor lines to one or more second voltages that are lower than the one or more first voltages, each of the plurality of distribution transformers further comprising a bottom portion connected to one or more of the plurality of low voltage conductor lines to distribute the one or more second voltages thereto from a respective one or more of the plurality of distribution transformers; and
 a plurality of open conductor devices, each of the plurality of open conductor devices being connected on a low voltage side of a respective distribution transformer and to a lateral end of a respective low voltage conductor line that is connected to the bottom portion of the respective distribution transformer, each of the plurality of open conductor devices configured to communicate a plurality of voltage readings to a master station via a global system for mobile (GSM) communication network and comprising:
  a power supply configured to supply power to the plurality of open conductor devices, the power supply comprising a voltage transformer and a rectifier circuit,
  a battery charging unit configured to charge a direct current (DC) battery as backup power supply, a GSM module configured to facilitate communication with the GSM communication network, a voltage sensing module configured to sense voltages of the plurality of low voltage conductor lines, and one or more microcontroller boards connected to the GSM communication network interface and configured to store a plurality of voltage loads of the plurality of low voltage conductor lines sensed by the voltage sensing module and to communicate the plurality of voltage loads using the GSM communication, the system further comprising one or more servers positioned remote from the plurality of open conductor devices and in proximity to a substation to define the master station, the master station being configured to determine a location of one or more broken or open conductor faults on the voltage distribution network, the master station comprising:

one or more processors;

one or more subscriber identification modules configured to facilitate communication with the GSM communication network;

one or more non-transitory computer-readable mediums encoded with one or more computer programs operable with the one or more processors to determine the location of the one or more broken or open conductor faults on the voltage distribution network, the computer program comprising the instructions of:

constructing a plurality of voltage distribution topology lookup tables for the voltage distribution network, the plurality of lookup tables comprising a topology of each of the plurality of high voltage conductor lines, each of the plurality of low voltage conductor lines, and each pathway to a common connection point via the plurality of high voltage conductor lines, the plurality of open conductor devices, and the plurality of low voltage conductor lines, determining, responsive to receiving a plurality of first voltage loads from the plurality of low voltage conductor lines over a predetermined period of time from the plurality of open conductor devices, a baseline voltage for each of the plurality of low voltage conductor lines, determining receipt of a plurality of second voltage loads that is at least a predetermined difference lower than the baseline voltage for the plurality of low voltage conductor lines, the plurality of second voltage loads being communicated from at least two of the plurality of open conductor devices via the GSM communication network to thereby define a plurality of fault detected conductor devices, identifying, responsive to the plurality of voltage distribution topology look up tables, each pathway that is shared by each of the plurality of fault detected conductor devices and the common connection point based on the plurality of voltage distribution topology lookup tables, and identifying, responsive to identifying each pathway that is shared, two of the plurality of fault detected conductor devices that are positioned furthermost downstream from the common connection point, a location of a broken or open conductor fault being in proximity to one or more of the plurality of high voltage conductor lines connected between the two of the plurality of fault detected conductor devices.

2. The system according to claim 1, wherein the plurality of first and second voltage loads comprise at least one of a plurality of line voltages and a plurality of phase voltages from the plurality of low voltage conductor lines.

3. The system according to claim 1, wherein the plurality of open conductor devices is configured to determine that the plurality of second voltages loads is not below the predetermined difference lower than the baseline voltage for the plurality of low voltages conductor lines, and transmit one or more of the plurality of second voltage loads to the master station at predetermined intervals.

4. The system according to claim 1, wherein the plurality of open conductor devices is configured to determine that the plurality of second voltage loads is at least the predetermined difference lower than the baseline voltage for the plurality of low voltages conductor lines, set an indicator indicating the low voltage conductor line having the plurality of second voltage loads determined to be the at least predetermined difference lower than the baseline voltage, and send one or more messages to the master station identifying the indicated low voltage conductor line and the plurality of second voltage loads.

5. The system according to claim 1, wherein each of the plurality of open conductor devices further comprises a battery switch circuit configured to prevent complete discharge the DC battery.

6. The system according to claim 1, wherein the one or more microcontroller boards is further configured to execute one or more commands for the transmission and receipt of one or more messages from and to the plurality of open conductor devices.

7. A system to detect one or more broken or open conductor faults on a medium voltage distribution network configured to distribute electric power to inland areas with high resistivity, the system comprising:

a medium voltage distribution network configured to distribute electric power to inland areas that have high resistivity, the medium voltage distribution network comprising a plurality of high voltage conductor lines, each having a common node, and a plurality of low voltage conductor lines;

a plurality of distribution transformers configured to reduce one or more first voltages received by one or more of the plurality of high voltage conductor lines connected to an upper portion of the plurality of distribution transformers to one or more second voltages that are lower than the one or more first voltages, each of the plurality of distribution transformers further comprising a bottom portion connected to one or more of the plurality of low voltage conductor lines to distribute the one or more second voltages thereto;

a plurality of open conductor devices, each of the plurality of open conductor devices being connected on a low voltage side of a respective distribution transformer and to a lateral end of a respective low voltage conductor line that is connected to the bottom portion of the respective distribution transformer, each of the plurality of open conductor devices configured to communicate a plurality of voltage readings to a master station via a global system for mobile (GSM) communication network and comprising:

a power supply configured to supply power to the plurality of open conductor devices, the power supply comprising a voltage transformer and a rectifier circuit, a battery charging unit configured to charge a DC battery to be used as backup power supply, a GSM communication network interface configured to facilitate communication with the GSM communication network, one or more microcontroller boards connected to the GSM communication network interface via a serial link, and a voltage sensing module configured to sense voltages of the plurality of low voltage conductor lines, the system further comprising one or more servers positioned remote from the plurality of open conductor devices and further near a substation to define the master station, the master station configured to determine a location of a broken or open conductor fault on the medium voltage distribution network, the master station comprising:

one or more processors;

one or more subscriber identification modules configured to facilitate communication with the GSM communication network;

one or more non-transitory computer-readable mediums encoded with one or more computer programs operable to determine the location of the broken or open conductor faults on the medium voltage distribution network, the computer program comprising the instructions of:

creating a plurality of lookup tables comprising a topology of the medium voltage distribution network, the plurality of lookup tables comprising a topology of each of the plurality of high voltage conductor lines, each of the plurality of low voltage conductor lines, and each pathway to a common connection point via the plurality of high voltage conductor lines, the plurality of open conductor devices, and the plurality of low voltage conductor lines, gathering a plurality of voltage loads of the plurality of low voltage conductor lines over a predetermined period of time from the plurality of open conductor devices, determining a baseline voltage for each of the plurality of low voltage conductor lines, when there is no broken or open conductor fault on the medium voltage distribution network, the baseline voltage being based on the gathered plurality of first voltage loads, determining a receipt of a plurality of second voltage loads that are at least a predetermined difference lower than the baseline voltage for the plurality of low voltage conductor lines, the plurality of second voltage loads being communicated from at least two of the plurality of open conductor devices using the GSM communication network to thereby define a plurality of fault detected conductor devices, identifying, responsive to the plurality of lookup tables, each pathway that is shared by each of the plurality of fault detected conductor devices and the common connection point based on the plurality of the lookup tables, and identifying, responsive to identifying each pathway that is shared, two of the plurality of fault detected conductor devices that are positioned furthermost downstream from the common connection point, a location of a broken or open conductor fault being on one or more of the plurality of high voltage conductor lines connected between the two of the plurality of fault detected conductor devices.

8. The system according to claim 7, wherein the plurality of first and second voltage loads comprise at least one of a plurality of line voltages and a plurality of phase voltages from the plurality of low voltage conductor lines.

9. The system according to claim 7, wherein the plurality of open conductor devices is configured to determine that the plurality of second voltages loads is not below the predetermined difference lower than the baseline voltage for the plurality of low voltages conductor lines, and transmit one or more of the plurality of second voltage loads to the master station at predetermined intervals.

10. The system according to claim 7, wherein the plurality of open conductor devices is configured to determine that the plurality of second voltage loads is at least the predetermined difference lower than the baseline voltage for the plurality of low voltages conductor lines, set an indicator indicating the low voltage conductor line having the plurality of second voltage loads determined to be the at least predetermined difference lower than the baseline voltage, and send one or more messages to the master station identifying the indicated low voltage conductor line and the plurality of second voltage loads.

11. The system according to claim 7, wherein each of the plurality of open conductor devices further comprises a battery switch circuit configured to prevent complete discharge the DC battery.

12. The system according to claim 7, wherein the one or more microcontroller boards is further configured to execute one or more commands for the transmission and receipt of one or more messages from and to the plurality of open conductor devices.

* * * * *